(12) United States Patent  
Itabashi et al.

(10) Patent No.: US 9,246,440 B2
(45) Date of Patent: Jan. 26, 2016

(54) DIFFERENTIAL AMPLIFIER

(71) Applicant: Sumitomo Electric Industries, LTD., Osaka-shi, Osaka (JP)

(72) Inventors: Naoki Itabashi, Yokohama (JP); Keiji Tanaka, Yokohama (JP); Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/077,816

(22) Filed: Nov. 12, 2013

(65) Prior Publication Data

US 2014/0132348 A1    May 15, 2014

(30) Foreign Application Priority Data

Nov. 12, 2012 (JP) ................... 2012-248431

(51) Int. Cl.
*H03F 3/45* (2006.01)
*H03F 1/22* (2006.01)

(52) U.S. Cl.
CPC ............ *H03F 1/22* (2013.01); *H03F 3/45183* (2013.01); *H03F 3/45475* (2013.01); *H03F 2203/45292* (2013.01); *H03F 2203/45644* (2013.01); *H03F 2203/45702* (2013.01)

(58) Field of Classification Search
CPC ........................................................ H03F 3/45
USPC ........................................ 330/261, 254, 252
See application file for complete search history.

(56) References Cited

U.S. PATENT DOCUMENTS

| | | | | |
|---|---|---|---|---|
| 4,258,331 | A * | 3/1981 | Nakayama | 330/261 |
| 4,573,022 | A * | 2/1986 | Koga | 330/307 |
| 4,668,881 | A * | 5/1987 | Piasecki | 327/52 |
| 6,563,382 | B1 * | 5/2003 | Yang | 330/254 |
| 7,057,460 | B2 * | 6/2006 | Kaviani et al. | 330/261 |
| 8,384,055 | B2 * | 2/2013 | Shimizu et al. | 250/551 |

FOREIGN PATENT DOCUMENTS

JP        08102622      4/1996

\* cited by examiner

*Primary Examiner* — Henry Choe
(74) *Attorney, Agent, or Firm* — Smith, Gambrell & Russell LLP.

(57) ABSTRACT

A differential amplifier with cascade transistors connected in series to switching transistors is disclosed. The base bias of the cascade transistors is set higher than the output LOW level of the cascade transistors by a preset amount of 0.1 to 0.2V, or lower than the input HIGH level of the switching transistors by the preset amount adding to a forward voltage of a junction diode, to provide a discharge current of the base-emitter junction Cbe from the bias control, or from the upstream stage to drive the differential circuit.

6 Claims, 11 Drawing Sheets

DIFFERENTIAL AMPLIFIER

BACKGROUND OF THE INVENTION

1. Field of the Invention

The present application relates to a differential circuit, in particular, a differential amplifier compensating undershoots appearing in outputs thereof.

2. Related Background Art

It has been known in the field that a differential circuit comprised of bipolar junction transistors (hereafter denoted as BJT) usually accompanies with undershoot in falling edges due to stray capacitors of the BJT. When such a differential circuit drives an optical modulator, the undershoot brings degraded optical output.

Figure 9:
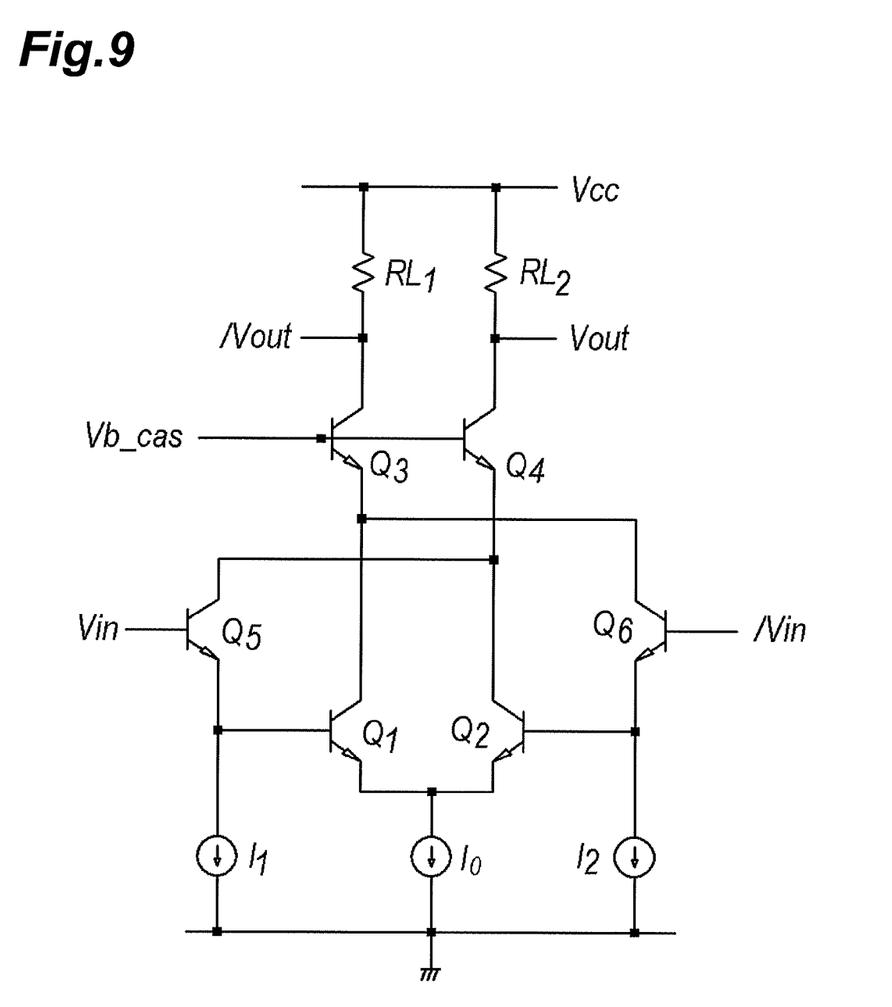
FIG. 9 shows a circuit diagram of a conventional differential amplifier to suppress undershoots.

A Japanese Patent application published as JP-H08-102622A has disclosed a differential amplifier that suppresses undershoots. FIG. 9 shows a circuit diagram of a differential amplifier disclosed therein where a discharged current of the junction capacitor Cbe between the base and emitter of transistors $Q_1$ ($Q_2$) is fed back in collector current of the other transistor $Q_2$ ($Q_1$) through a driving transistor $Q_5$ ($Q_6$). Thus, the discharge current is compensated from flowing in load resistors, and undershoots appearing in the output due to the current flowing in the load resistor are suppressed.

However, an additional transistor $Q_5(Q_6)$ is necessary in the conventional circuit shown in FIG. 9, which needs to raise the power supply voltage by at least a base-emitter voltage Vbe, which is typically about 0.8 V. Thus, the power consumption of the amplifier increases.

SUMMARY OF THE INVENTION

One aspect of the present application relates to an amplifier with the differential configuration. The amplifier comprises a pair of switching transistors each driven complimentarily, a pair of load resistors each connected in series to the switching transistors, a pair of cascade transistors each connected in series to the switching transistors and put between the load resistors and the switching transistors, and a bias control. The bias control provides a base level of the cascade transistors that is higher than an output LOW level of the cascade transistors by an offset amount. The discharge current for the base-emitter junction diode of the switching transistors is provided from or absorbed in the bias control through the cascade transistors.

The bias control includes first and second current sources and a resistor. The first current source is connected in series to the resistor and provides a current corresponding to a maximum current flowing in the load resistors. The resistor has resistance corresponding to resistance of the load resistors. The second current source is connected in parallel to the resistor to decrease a current flowing in the resistor by a preset amount. The offset amount of the base level is determined by the current provided from the second current source multiplied by resistance of the resistor in the bias control.

In a modified arrangement of the bias control, the bias control further includes a voltage follower and another resistor. The other resistor is put between the output of the voltage follower, which reflects the level between the first current source and the resistor, and the second current source to provide another current to the other resistor. The offset amount of the base level is determined by the other current provided from the second current source multiplied by resistance of the other resistor.

In another arrangement of the amplifier, the amplifier includes a differential circuit and an upstream stage to drive the differential circuit. The differential circuit includes a pair of switching transistors each driven complementarily, a pair of load resistors each connected in series to the switching transistors, a pair of cascade transistors each put between the load resistors and the switching transistors, and a bias control. The bias control provides a base level of the cascade transistors that is higher than the input HIGH level of the switching transistors by a forward voltage of a junction diode subtracted by an offset amount. The discharge current of the base-emitter junction diode of one of the switching transistors is provided from or absorbed in the upstream stage through the other of the switching transistors.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, details of a differential amplifier according to some embodiments will be described as referring to drawings. In the description of the drawings, numerals or symbols same or similar to each other will refer to elements same or similar to each other without overlapping explanations.

First, a mechanism causing undershoots will be described as referring to an ordinary differential amplifier.

Figure 10:
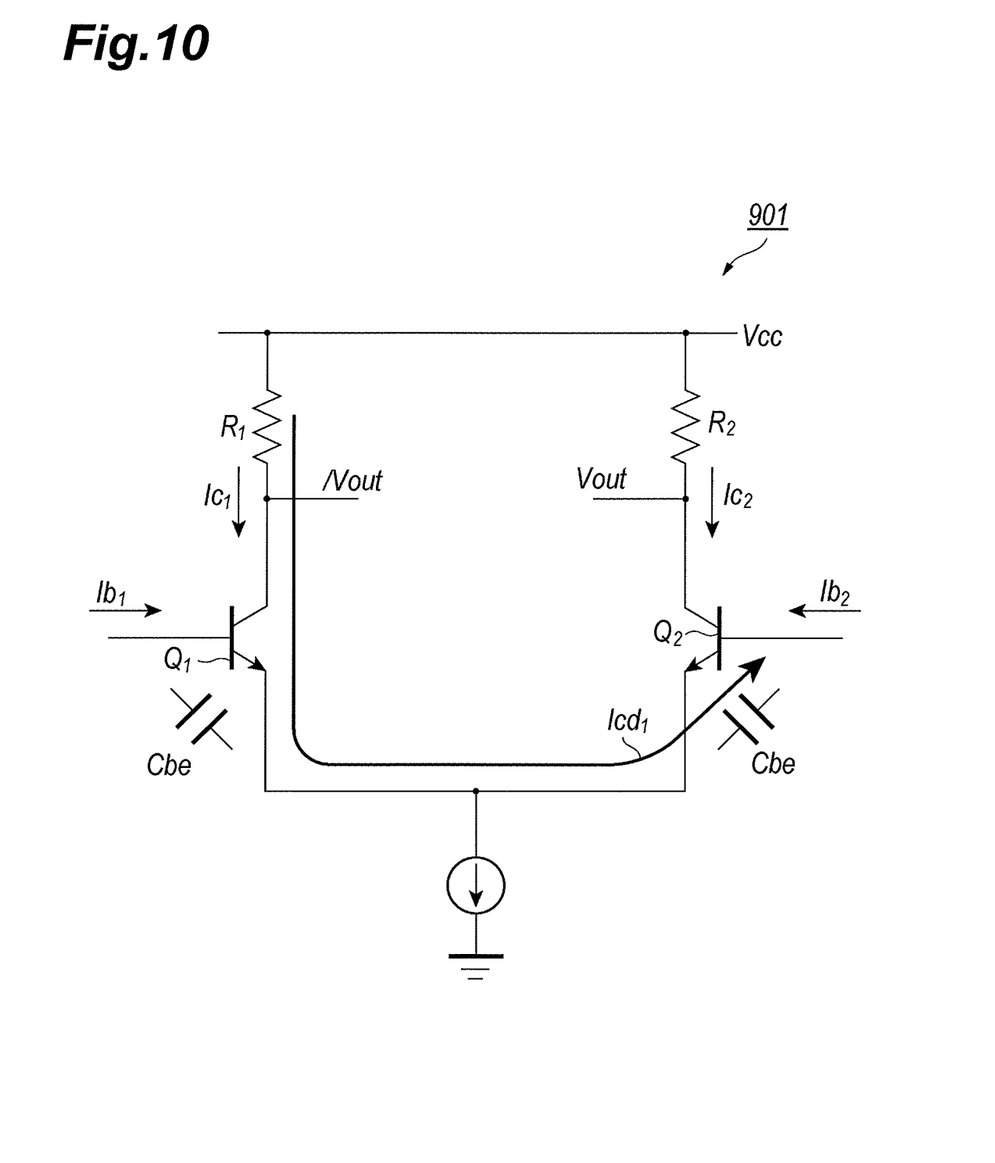
FIG. 10 explains a current path causing the undershoot in the output of the conventional differential amplifier.
Figure 11:
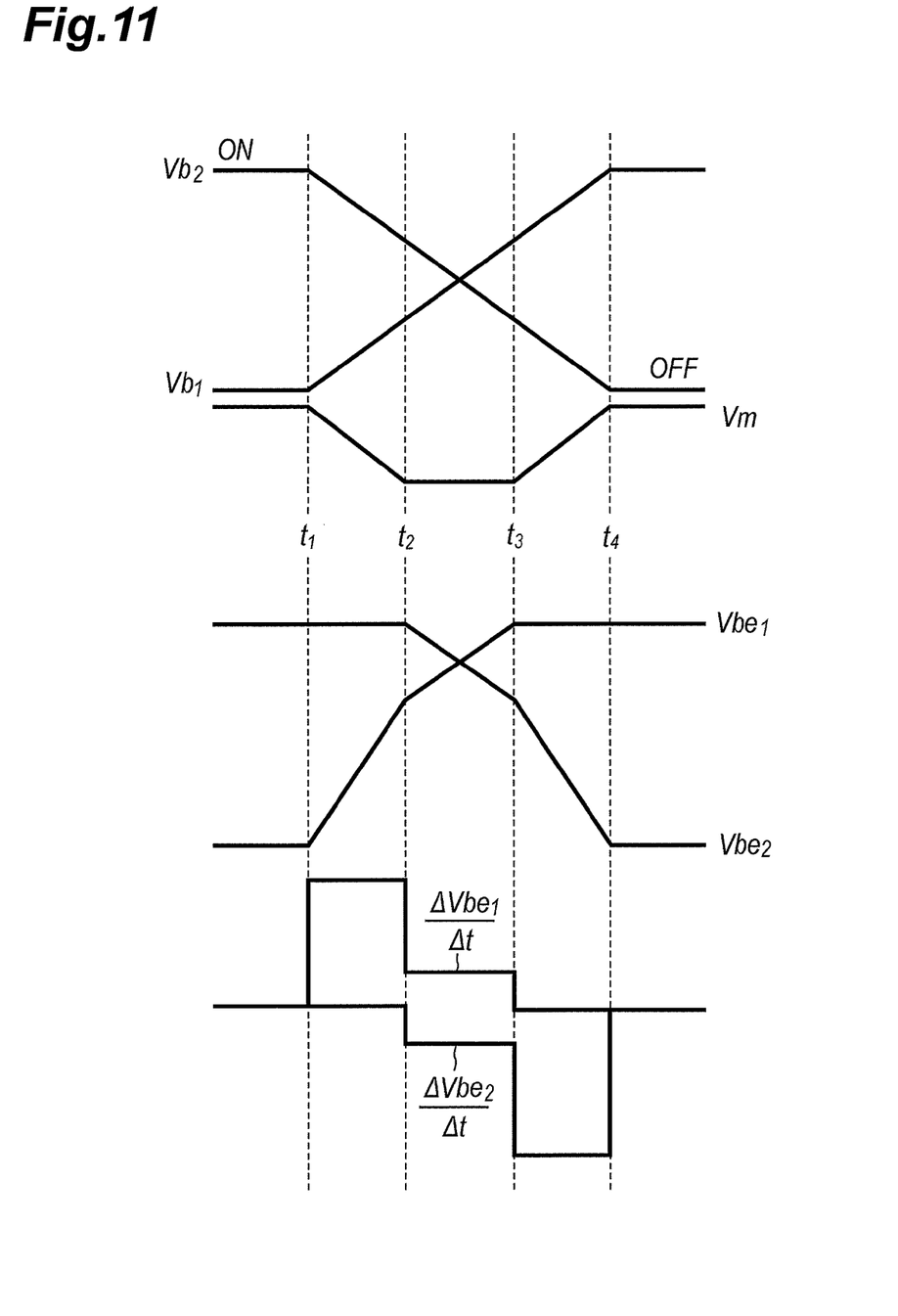
FIG. 11 schematically explains a mechanism to cause undershoots and overshoots in the outputs of the differential amplifier.

FIG. 10 is a circuit diagram of a primitive differential circuit 901; while, FIG. 11 shows time charts of respective nodes in the differential circuit 901. The differential circuit 901 provides a pair of transistors, $Q_1$ and $Q_2$, whose emitters are commonly grounded through a current source. The outputs, Vout and /Vout, of the differential circuit 901 are brought from collectors of the transistors, $Q_1$ and $Q_2$, where the symbol slash "/" means that a signal denoted by an element subsequent to the slash has a phase opposite to the element without the slash.

Two outputs, Vout and /Vout, complementary to each other are denoted as:

$$/Vout=Vcc-R_1 \times Ic_1, \text{and}$$

$$Vout=Vcc-R_2 \times Ic_2,$$

where Vcc, $R_n$, and $Ic_n$ (n=1, 2) are power supply voltage, resistance of load resistors, and collector currents of respective transistors, $Q_1$ and $Q_2$. That is, the output voltages, Vout and /Vout, in the DC mode are given by a voltage reduced by a voltage drop caused in load resistors due to respective collector current from the power supply Vcc. Neglecting the stray capacitors and junction capacitors in the AC mode, the current and/or voltage of respective nodes are fully denoted by the binary state. However, taking the junction capacitors between base and emitter Cbe into account, the current to charge/discharge this base-emitter capacitor Cbe flows in respective load resistors, $R_1$ and $R_2$, which causes the undershoots in the outputs, Vout and /Vout. The current $Icd_1$ denoted by a solid line in FIG. 10 corresponds to this charge/discharge current.

The explanation below describes the charge and the discharge of the junction capacitor Cbe during the transition of the transistor $Q_1$ from the state of turning off to the other state of turning on; while, the other transistor $Q_2$ transits from the turning on state to the turning off state. FIG. 11 schematically shows the base level Vb, the common emitter level Vm, the base-emitter bias Vbe, and the charge/discharge current flowing from the base to the emitter of two transistors, $Q_1$ and $Q_2$, which corresponds to the time differential of the base-emitter bias Vbe. The transistor $Q_1$ turns off, while, the transistor $Q_2$ turns on until the instant $t_1$. In the transition from the instant $t_1$ to $t_2$, the base level of the transistor Q1 rises linearly, while, the base level of the other transistor $Q_2$ falls with a constant rate. From $t_1$ to $t_2$, the base-emitter bias Vbe of the transistor $Q_1$ is yet insufficient to turn on the transistor $Q_1$; accordingly, a current determined by the current source fully flows in the other transistor $Q_2$. The constant current source determines the magnitude of this current, and the common emitter level Vm decreases as the base level of the second transistor $Q_2$ falls to set the bias Vbe of the transistor $Q_2$ in a condition to flow the current determined by the current source.

At the time $t_2$, the transistor $Q_1$ begins to turn on by the rising of the base level thereof and the falling of the common emitter level Vm, which increases the bias Vbe of the transistor $Q_1$. From $t_2$ to $t_3$, two transistors, $Q_1$ and $Q_2$, both turn on to flow respective currents depending on the base bias Vbe of the transistors, $Q_1$ and $Q_2$.

The increase of the base bias of the transistor $Q_1$ is enhanced from $t_1$ to $t_2$ because the increase of the base level overlaps with the decrease of the emitter level Vm in the transistor $Q_1$. From $t_2$ to $t_3$, where the increase of the base level continues but the emitter level is set substantially in constant, the increase of the base bias Vbe of the transistor $Q_1$ becomes moderate compared with the former period from $t_1$ to $t_2$. After $t_3$, the increase of the base level and that of the emitter level becomes substantially equal; then, the base bias Vbe is set substantially in constant. For the other transistor $Q_2$, the decrease of the base bias Vbe, that of the base level, and that of the emitter level show opposite behaviors from $t_1$ to $t_4$.

The charge and/or discharge current of the junction capacitor Cbe of the transistors, $Q_1$ and $Q_2$, becomes proportional to the time differentiation of the base bias Vbe, namely, $\Delta(Vbe)/\Delta t$ Specifically, a large charge current for the junction capacitor Cbe of the transistor $Q_1$ flows into this transistor $Q_1$ from the upstream driver through the base thereof, and the charge current gradually decreases from $t_2$ to $t_3$, and from $t_3$ to $t_4$. On the other hand, the transistor $Q_2$ charges the junction capacitor Cbe at $t_1$ because the base bias $Vbe_2$ thereof is in HIGH. From $t_2$ to $t_3$, the carriers charged in the capacitor Cbe are gradually discharged, and a current to discharge the capacitor Cbe extraordinarily increases from $t_3$ to $t_4$; however, the discharge current does not flow in the transistor $Q_2$ because this transistor $Q_2$ is turned off from $t_3$ to $t_4$. Moreover, the current determined by the current source fully flows in the transistor $Q_1$; that is, the current source does not have any room to absorb the discharge current of the transistor $Q_2$. As a result, the discharge current comes out from the power supply Vcc passing the transistor $Q_1$ and the load resistor connected in the transistor $Q_1$, which induces a large voltage drop in the load resistor. Thus, the differential circuit shown in FIG. 10 inevitably has a large undershoot in the falling edge of the output thereof.

Figure 1:
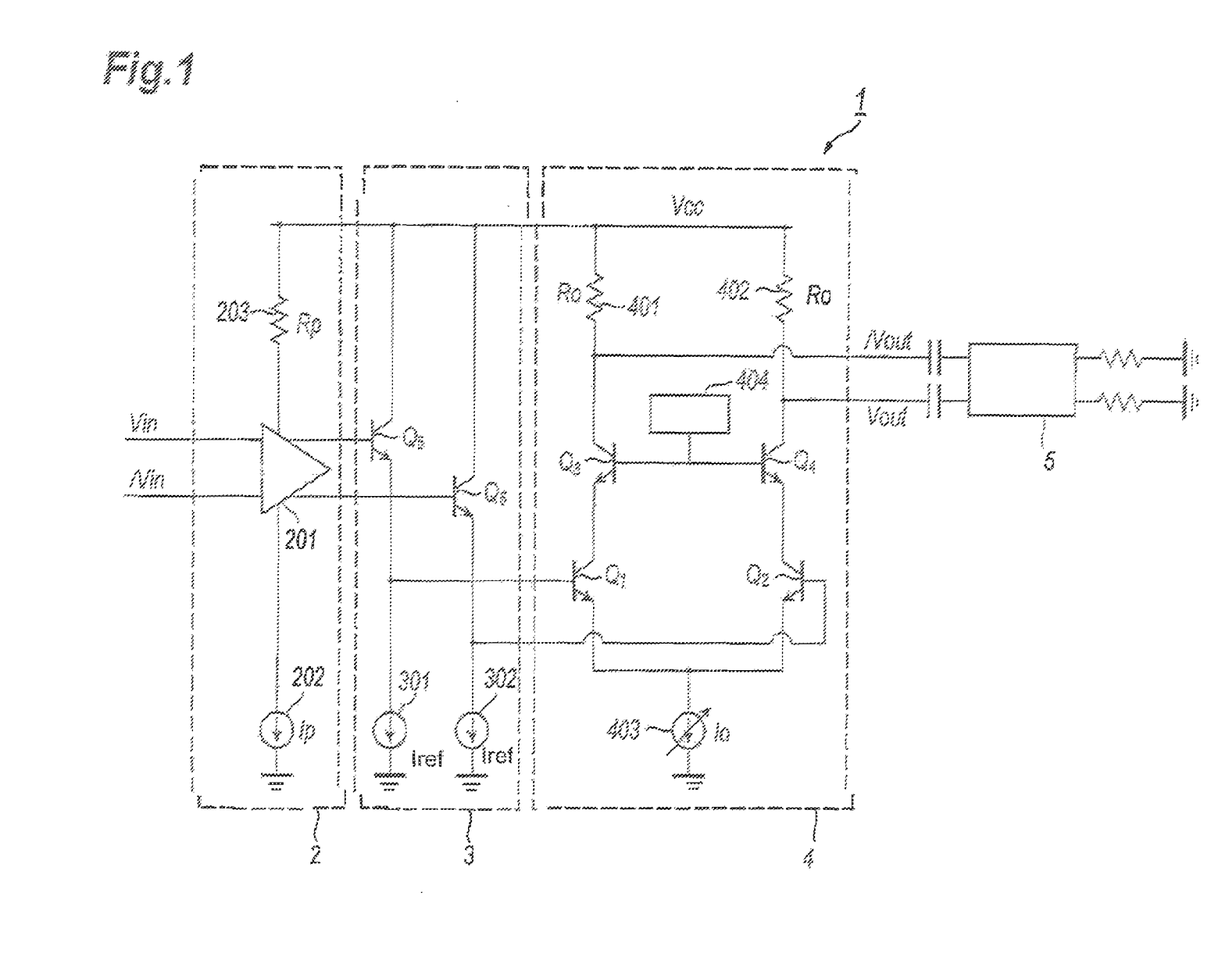
FIG. 1 shows a circuit diagram of a differential amplifier according to an embodiment.

Next, an embodiment of the present application will be described. FIG. 1 is a circuit diagram of a differential circuit according to an embodiment. The differential circuit 1 primarily comprises an upstream stage including a preamplifier 2 and an emitter follower 3, and a post amplifier 4. The upstream stage drives the post amplifier 4.

The preamplifier 2 drives, receiving inputs, Vin and /Vin, the emitter follower 3. The preamplifier 2 includes a differential amplifier 201, a current source 202 to extract a current Ip from the differential amplifier, and a resistor 203 connected between the power supply Vcc and the differential amplifier 201, which is often called as a common resistor. The emitter follower 3 includes two transistors, $Q_5$ and $Q_6$, whose bases are coupled with the outputs of the differential amplifier 201, and two current sources, 301 and 302, each extracts current Iref from the transistors, $Q_5$ and $Q_6$.

The post amplifier 4 amplifies the outputs of the emitter follower 3 differentially and generates outputs, Vout and /Vout, to drive differentially a load device 5 such as an optical modulator.

Specifically, the post amplifier 4 includes a pair of transistors, $Q_1$ and $Q_2$, each having emitters commonly connected to each other; load resistors, 401 and 402, with resistance Ro and each connected in series to respective transistors, $Q_1$ and $Q_2$; a pair of cascade transistors, $Q_3$ and $Q_4$, each connected in series to the transistors, $Q_1$ and $Q_2$, and between the transistors, $Q_1$ and $Q_2$, and the load resistors, 401 and 402; a current source 403 connected to the common emitter of the transistors, $Q_1$ and $Q_2$, to determine the amplitude of the outputs, Vout and /Vout; and a bias control 404 connected to the bases of the cascade transistors, $Q_3$ and $Q_4$. The paired transistors, $Q_1$ and $Q_2$, operate differentially by receiving signals in the bases thereof.

Figure 2:
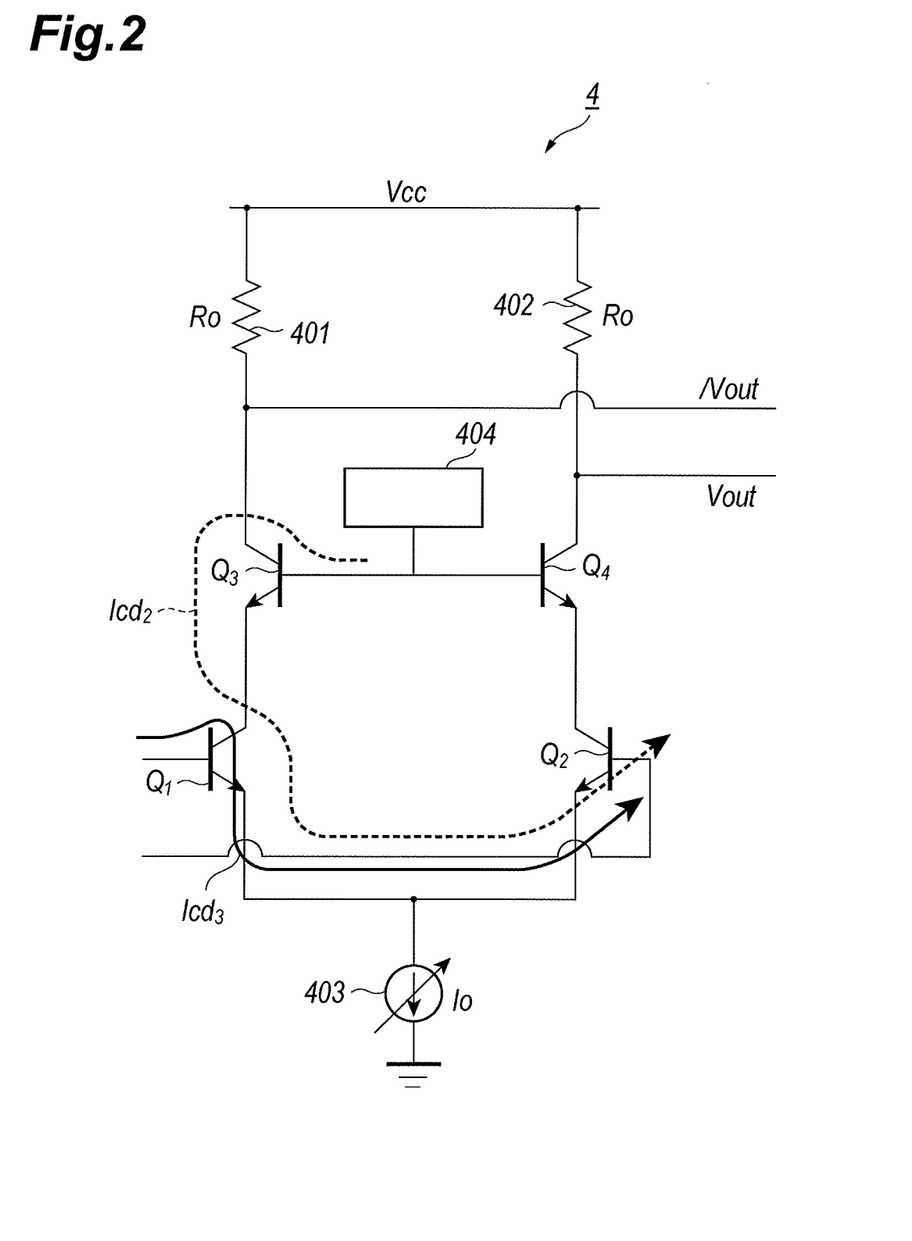
FIG. 2 explains a current path to discharge a junction capacitor caused in the differential circuit.

The bias control 404 determines the base level Vb_cas of the cascade transistors, $Q_3$ and $Q_4$, such that the discharge current of the junction capacitor Cbe caused in one of the transistors, $Q_1$ and $Q_2$, is absorbed thereby through the other transistor, $Q_2$ and $Q_1$, without flowing in the load resistors, 401 and 402. FIG. 2 schematically illustrates the discharge path of the junction capacitor. That is, the bias control 404 sets the base level Vb_cas slightly higher, typically 0.1 to 0.2 V, than the collector LOW level of the cascade transistors, $Q_3$ and $Q_4$. Then, the junction diode inherently attributed between the base and collector of a transistor is forwardly biased and the discharge current caused in the transistor $Q_2$ is absorbed by the bias control 404 through the path $Icd_2$ without flowing in the load resistor 401.

Figure 3:
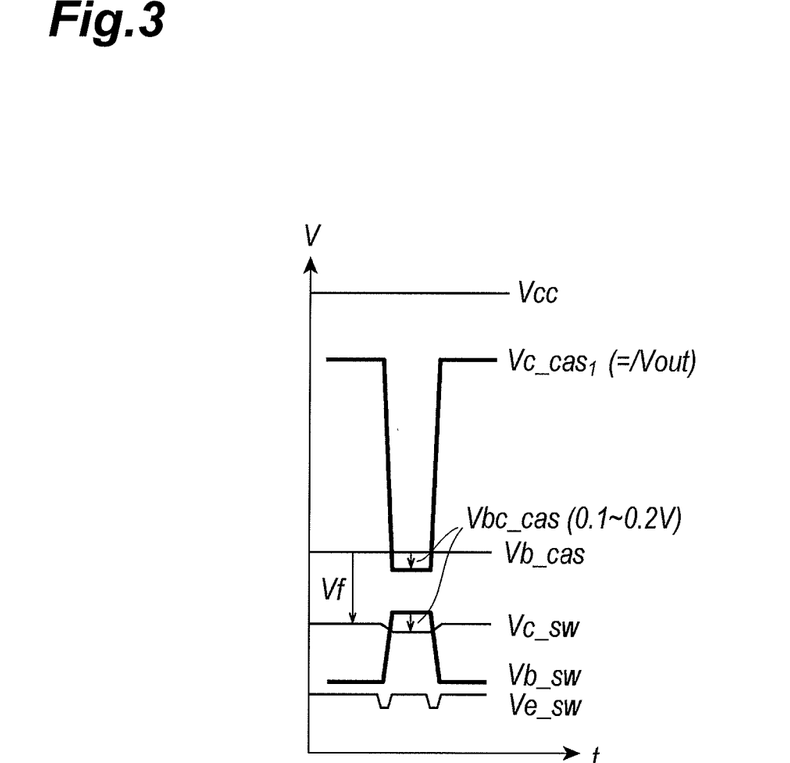
FIG. 3 schematically explains respective levels of a switching transistor and a cascade transistor.

FIG. 3 shows transient behaviors of two transistors, $Q_1$ and $Q_3$, against the input signal Vb_sw provided to the base of the transistor $Q_1$. Even when the transistor $Q_1$ receives the input pulse signal Vb_sw, the output thereof, namely the collector level Vc_sw of the switching transistor $Q_1$ is set almost invariant because of the existence of the cascade transistor $Q_3$. The cascade transistor $Q_3$, which is equivalently the base grounded configuration, in the collector thereof outputs an amplified signal /Vout. In the present embodiment, the base level Vb_cas of the cascade transistor $Q_3$ is set higher than the LOW level of the output Vc_cas thereof by 0.1 to 0.2V.

Figure 4:
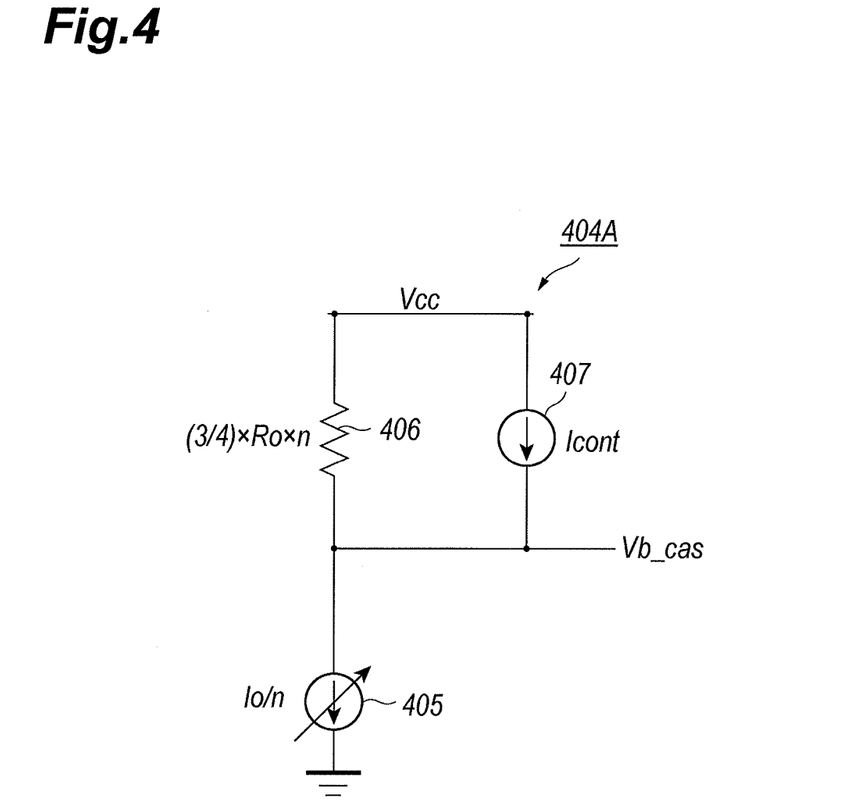
FIG. 4 shows a circuit diagram of a bias control according to the first embodiment.

FIG. 4 is a circuit diagram of an example of the bias control 404. The circuit 404A shown in FIG. 4 includes two current sources, 405 and 407, and a resistor 406. The former source 405 provides a current $I_0/n$ corresponding to the current $I_0$ provided by the current source 403 and flowing in two resistors, 401 and 402, of the post amplifier 4, where n is a factor to save the power consumption of the circuit. The latter current source 407 in the bias control 404A provides a current Icont to the other current source 405. The resistor 406 has resistance $R_o \times (3/4) \times n$, where $R_0$ is resistance of the load resistors, 401 and 402.

The circuit 404A outputs the base level Vb_cas to the cascade transistors, $Q_3$ and $Q_4$, which is higher than the LOW level of the output /Vout by a preset amount. In the LOW level of the output /Vout, the current $I_0$ attributed to the current source 403 fully flows in one of the load resistors 401, and the practical level thereof is given by: $/Vout(LOW) = Vcc - I_0 \times R_0$.

Distinguishing AC load from DC load of the post amplifier 4, the output /Vout swings around the average level $Vcc - I_0 \times R_0$ with amplitude of $I_o \times R_o/2$. The DC load corresponds to the load resistors, 401 and 402; while, the AC load means, when the outputs, Vout and /Vout, are coupled with the external device through coupling capacitors, a parallel circuit of the load resistors, 401 and 402, with the input impedance of the external device. Assuming that the external device has the input impedance same as resistance of the load resistors, 401 and 402, namely $R_0$; the AC load becomes $R_0/2$. Accordingly, the LOW level of the output /Vout becomes:

$$/Vout(LOW) = Vcc - (I_O \times R_O/2 + I_O \times R_O/4) = Vcc - I_O \times R_O(3/4).$$

Then, decreasing the current $I_0$ by one n-th, while, increasing resistance $R_0$ by 3/4 multiplied by n; a series circuit of the resistor 406 with resistance $3/4 \times R_0 \times n$ and the current source 405 providing the current $I_0/n$ generates a replica of the LOW level of the output /Vout.

That is, the circuit 404A shown in FIG. 4 emulates the LOW level of the output /Vout when the current source 407 is omitted. Adding the current source 407 that provides the current Icont, the output of the circuit 404A, namely, the node between the resistor 406 and the current source 405, a current flowing in the resistor 406 decreases by the current Icont provided from the other current source 407, which raises the output Vb_cas by $Icont \times (3/4) \times R_0 \times n$. Accordingly, selecting a current Icont and the factor n such that a voltage derived from this relation $Icont \times (3/4) \times R_0 \times n$ becomes 0.1 to 0.2V, the base level Vb_cas becomes an optimum to suppress the undershoots appeared in the falling edge of the outputs, Vout and /Vout. The circuit 404A generates the offset of the base level Vb_cas from the LOW level, namely $Icont \times (3/4) \times R_0 \times n$, independent of the power supply Vcc, and the current $I_0$.

In order to secure the further stable operation of the circuit 404A, the current Icont is preferably almost ten (10) times greater than the base input current for the cascade transistors, $Q_3$ and $Q_4$, which is typically a few microamperes to a few tens of microamperes; specifically, the current Icont is preferably set to be several tens of microamperes to several hundreds of microamperes.

Figure 5:
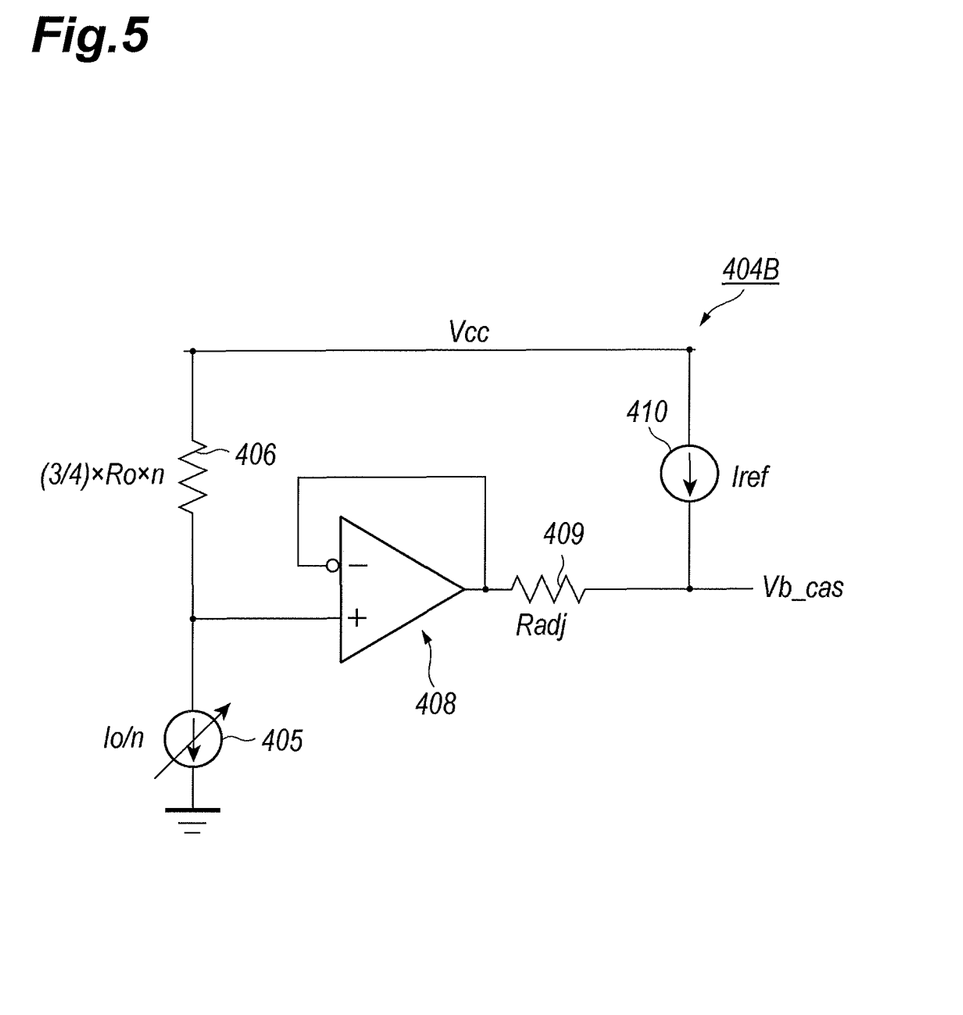
FIG. 5 shows a circuit diagram of a bias control according to the second embodiment.

FIG. 5 is another example of the bias control 404B that includes a current source 405 and a resistor 406 where they are connected in series between the power supply Vcc and the ground, and another current source 410, which is the same as those of the aforementioned example 404A. The circuit 404B further includes an operational amplifier 408 with the voltage follower configuration and a resistor 409 with resistance of Radj. The former current source 405 provides a current $I_0/n$; while, the other current source 410 provides a current Iref. The base bias Vb_cas for the cascade transistors, $Q_3$ and $Q_4$, is output through the resistor 409.

Because of the voltage follower configuration of the operational amplifier 408, the output thereof virtually becomes the same with the non-inverting input thereof. Specifically, the level determined by the resistor 406 whose resistance is $(3/4) \times R_0 \times n$ multiplied by current $I_0/n$, namely, $Vcc - (3/4) \times R_0 \times I_0$, which reflects the LOW level of the output /Vout, appears in the output of the operational amplifier 408. The output Vb_cas of the circuit 404B adds an offset voltage caused by the resistor 409 multiplied by the current Iref provided from the current source 410 to the output of the operational amplifier 408. Adjusting the current Iref and resistance Radj such that the offset voltage derived from the multiplication of these values becomes 0.1 to 0.2 V, the base level Vb_cas for the cascade transistors, $Q_3$ and $Q_4$, is optimally set. Because the offset voltage, $Radj \times Iref$, is independent of the power supply Vcc and the current $I_0$, the output Yb_cas always gives the constant offset with respect to the LOW level of the output of the post amplifier 4.

In order to operate the bias control 404B further stably, the current Iref is preferably about ten (10) times greater than the base bias current of the cascade transistors, $Q_3$ and $Q_4$. Because the latter current, the base bias current, is typically several microamperes to several tens of microamperes, the current Iref is preferably several tens of microamperes to several hundreds of microamperes.

Thus, the differential circuit with the paired switching transistors, $Q_1$ and $Q_2$, paired cascade transistors, $Q_3$ and $Q_4$, each connected in series to respective switching transistors and the bias control 404 effectively suppresses the undershoots appeared in the falling edge of the output of the differential circuit caused by the discharge current of the base-emitter junction capacitors Cbe by setting the base level of the cascade transistors, $Q_3$ and $Q_4$, higher than the LOW level of the output by 0.1 to 0.2V by the bias control 404 without implementing any other specific circuit. In such a configuration, the discharge current caused in one of the switching transistors, $Q_1$ and $Q_2$, is provided from the bias control 404 not the load resistor 401 or 402 through the other switching transistor, $Q_2$ or $Q_1$.

Specifically, the bias control, 404 to 404B, sets the base of the cascade transistors, $Q_3$ and $Q_4$, in a level higher than the output LOW level of the post amplifier 4, namely, the collector of the cascade transistors, $Q_3$ and $Q_4$, by 0.1 to 0.2 V. In such a base-collector bias Vbc, the junction capacitance Cbc therebetween abruptly increases. Then, the discharge current derived from the switching transistors, $Q_1$ and $Q_2$, flows in the path from the base to the collector.

Also, in the differential circuit 1, the discharge current derived from the junction capacitance Cbe between the base and emitter of the switching transistor $Q_2$ is provided from the base of the cascade transistor $Q_3$ through the cascade transistor $Q_3$ and the other switching transistor $Q_1$. The undershoot appeared in the falling edge of the output Vout generated by the switching transistor $Q_2$ is effectively suppressed. Also, the bias controls, 404A and 404B, automatically set the base bias of the cascade transistors, $Q_3$ and $Q_4$, in the level higher than the LOW level of the collector output of the cascade transistors, $Q_3$ and $Q_4$, by 0.1 to 0.2V.

The invention of the present application is not restricted to those described above. For instance, the embodiments above described flow the discharge current of the junction capacitor Cbe of the switching transistor which is provided from or absorbed in the bias control through the cascade transistor $Q_3$ and the other switching transistor $Q_1$. However, the discharge current of the junction capacitance Cbe is preferably provided from or absorbed in the base of the other switching transistor $Q_1$. Specifically, setting the base HIGH level of the other switching transistor $Q_1$ higher than the collector LOW level thereof by a preset condition, namely 0.1 to 0.2V higher; the discharge current for the junction capacitance Cbe of the switching transistor $Q_2$ is effectively provided from or absorbed in the base of the other switching transistor $Q_1$ through the path $Icd_3$ shown in FIG. 2, that is, the discharge current is effectively provided from the upstream stage of the emitter follower 3.

Figure 6:
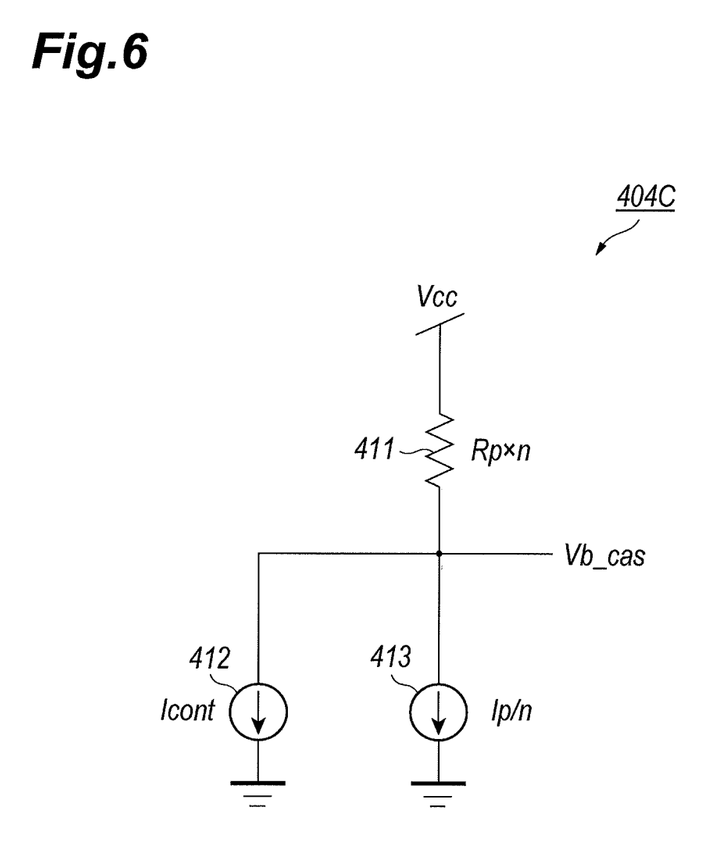
FIG. 6 shows a circuit diagram of a bias control according to the third embodiment.

FIG. 6 shows a circuit diagram of the bias control 404C according to a modified embodiment applicable to the situation described above. The bias control 404C includes a resistor 411 and two current sources, 412 and 413, each connected in series to the resistor 411. The bias control 404C biases the base of the cascade transistors, $Q_3$ and $Q_4$, such that the collector level of the switching transistor, $Q_1$ or $Q_2$, is lower than the base HIGH level thereof by 0.1 to 0.2 V. Because the cascade transistors, $Q_3$ and $Q_4$, in the base-emitter thereof are biased in the forward voltage of the junction diode, and the base level levels of the switching transistors, $Q_1$ and $Q_2$, are lowered by the forward voltage of the junction diode formed by the transistors, $Q_5$ and $Q_6$, in the emitter follower 3 from the output of the amplifier 2; the bias control 404C outputs the level lowered by the preset amount from the output HIGH level of the amplifier 2. In other words, the bias control 404C outputs the level increased by the forward voltage of the junction diode subtracted by the preset voltage from the output HIGH level of the emitter follower 3.

Specifically, when the amplifier 2 in the upstream stage outputs HIGH level, which is determined by resistance Rp and the current Ip, the replica in the bias control 404C is, similar to the aforementioned bias controls, 404A and 404B, determined by the current Ip/n of the current source 413 and resistance Rp×n of the resistor 411 connected in series between the power supply Vcc and the ground, which emulates the output HIGH level of the amplifier 2. In addition to those elements, the bias control 404C includes an additional current source 412 to generate the preset offset voltage determined by Icont×Rp×n, where Icont is the current of the current source 412. Setting the current flowing in the emitter follower 3 by the current sources, 301 and 302, such that the current density of the transistors, $Q_5$ and $Q_6$, to be substantially equal to the current density of the cascade transistors, $Q_3$ and $Q_4$; the forward junction voltage of the transistors, $Q_5$ and $Q_6$, is set to be equal to that of the cascade transistors, $Q_3$ and $Q_4$.

When the current source 202 depends on a temperature, the current source 413 in the bias control 404C preferably shows temperature dependence the same as that of the current source 202. The bias control 404C effectively suppresses the undershoot independent of the temperature. In order to operate the bias control 404C further stably, the current Icont+Ip/n determined by two sources, 412 and 413, is preferably about ten (10) times greater than the base bias current Ib of the switching transistors, $Q_1$ and $Q_2$. The latter current Ib is typically from several microamperes to several tens of microamperes, so, the output current of the bias control 404C is preferably from several tens of microamperes to several hundreds of microamperes.

The bias control 404C, as schematically shown in FIG. 6, sets the collector levels Vc_sw of the switching transistors, $Q_1$ and $Q_2$, lowered by the preset amount from the HIGH state of the base input, $Vb\_sw_1$ and $Vb\_sw_2$. Thus, the base-collector bias Vbc_sw of the switching transistors, $Q_1$ and $Q_2$, is kept in this preset amount when the switching transistors, $Q_1$ and $Q_2$, turn on; and the undershoots appearing in the falling edge are effectively suppressed. The bias control 404C, compared with the aforementioned bias controls, 404A and 404B, where they set the base level of the cascade transistors, $Q_3$ and $Q_4$, with respect to the collector levels thereof, sets the base-collector bias Vbc_cas of the cascade transistors, $Q_3$ and $Q_4$, in a reverse bias condition for the junction therebetween, which reduces the junction capacitance Cbc thereof, and the differential amplifier 1 shows a preferable output performance with relatively lower reflection performance.

The junction capacitance between the base and the collector of the switching transistor, $Q_1$ and $Q_2$, operates as miller capacitance to degrade high frequency performances of the switching transistors, $Q_1$ and $Q_2$; typically the switching speed of the transistors, $Q_1$ and $Q_2$, is lowered. The bias control 404C of the embodiment sets the base-collector bias Vbc_sw of the switching transistors, $Q_1$ and $Q_2$, in a forwardly biased condition of the junction but the absolute amount thereof is only 0.1 to 0.2V; and sets this bias only for the state where the switching transistors, $Q_1$ and $Q_2$, turn on. Thus, the bias control 404C suppresses the undershoot without degrading the high frequency performance of the differential amplifier 1.

Figure 7:
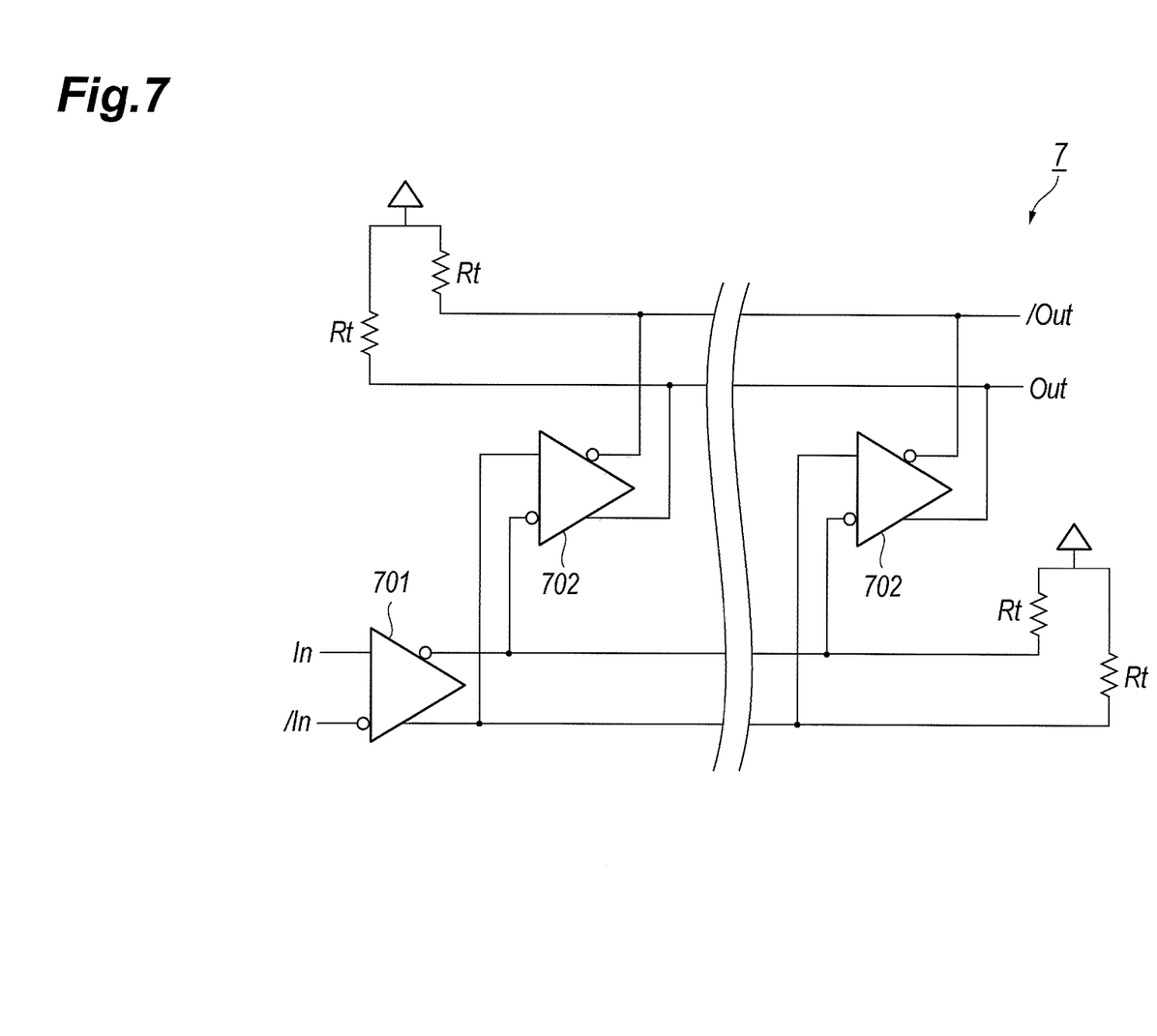
FIG. 7 schematically shows a circuit diagram of a travelling wave amplifier (TWA) implemented with the differential amplifier shown in FIG. 1.
Figure 8A:
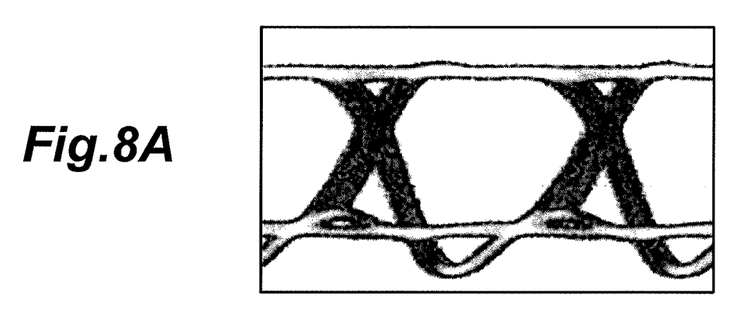
FIGS. 8A to 8C compare the outputs of the TWA shown in FIG. 7 when cell amplifiers have the arrangement of a conventional one with no bias control, with a bias control shown in FIG. 4, and a bias control shown in FIG. 6.
Figure 8B:
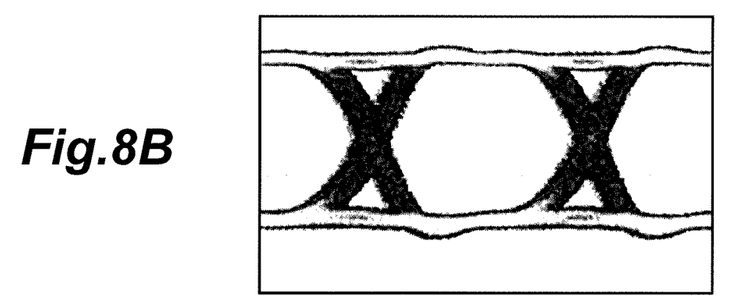
Figure 8C:
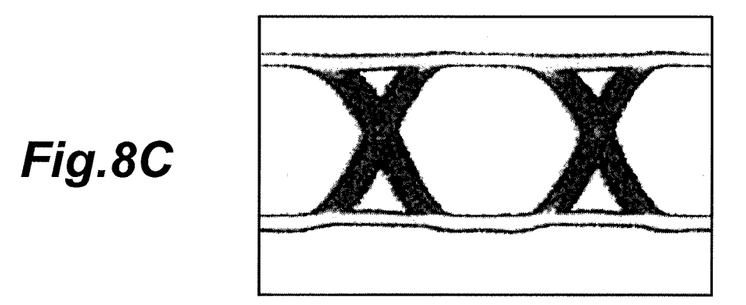

One of the applications of the differential circuit 1 thus described is for a travelling wave amplifier (TWA) shown in FIG. 7. The TWA 7 includes a pre-buffer 701 to receive inputs, In and /In, differentially; a plurality of cell amplifiers 702 each connected in parallel between the outputs, Out and /Out, and the pre-buffer 701; and some termination resistors Rt. The inner configuration of the cell amplifiers 702 is the same as those of the differential circuit 1, or that of the post-amplifier 4 involved in the differential circuit 1. Commonly setting the base level Vb_cas of the cascade transistors in respective cell amplifiers 702 in the level Vb_cas described above, the discharge current is reduced to flow in the load resistors and the undershoot is effectively suppressed. FIGS. 8A to 8C compare the suppression of the undershoot, where FIGS. 8A to 8C correspond to results where no bias control is implemented (FIG. 8A), the bias control 404A shown in FIG. 4 is used, and the bias control 404C shown in FIG. 6 is used. The latter two, FIGS. 8B and 8C, indicate that either of the bias controls effectively suppresses the undershoot.

In the foregoing detailed description, the circuits of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:
1. An amplifier, comprising
   a pair of switching transistors, each switching transistor being driven complementarily;
   a pair of load resistors, each load resistor being connected in series to one of the switching transistors;

a pair of cascade transistors, each cascade transistor being between one of the load resistors and one of the switching transistors; and a bias control configured to provide a base level of the cascade transistors, the base level being higher than an output LOW level of the cascade transistors by an offset amount to provide a discharge current of the switching transistors from the bias control, wherein the bias control includes a first current source, a second current source and a resistor, the first current source being connected in series to the resistor and providing a current corresponding to a maximum current flowing in the load resistors, the resistor having a resistance corresponding to the resistance of the load resistors, the second current source being connected in parallel to the resistor to reduce a current flowing in the resistor by a preset amount, and wherein the offset amount of the base level is determined by the current provided from the second current source in the bias control multiplied by the resistance of the resistor in the bias control.

2. The amplifier of claim 1, wherein the current provided from the first current source is one n-th of the maximum current, and the resistance of the resistor corresponds to n times the resistance of one of the load resistors.

3. An amplifier, comprising:

a pair of switching transistors, each switching transistor being driven complementarily;

a pair of load resistors, each load resistor connected in series to one of the switching transistors;

a pair of cascade transistors, each cascade transistor being between one of the load resistors and one of the switching transistors; and a bias control configured to provide a base level of the cascade transistors, the base level being higher than an output LOW level of the cascade transistors by an offset amount to provide a discharge current of the switching transistors from the bias control, wherein the bias control includes a first current source, a second current source, a first resistor connected in series to the first current source, a second resistor, and a voltage follower, the first current source providing a current corresponding to a maximum current flowing in the load resistors, the first resistor having a resistance corresponding to the resistance of the load resistors, the voltage follower reflecting a level between the first current source and the first resistor to one terminal of the second resistor, the second current source being connected in series to the second resistor and providing another current in the second resistor;

wherein the offset amount of the base level is determined by the another current provided from the second current source multiplied by the resistance of the second resistor; and wherein the base level is provided between the second current source and the second resistor.

4. The amplifier of claim 3, wherein the current provided from the first current source is one n-th of the maximum current, and the resistance of the first resistor corresponds to n times the resistance of one of the load resistors.

5. An amplifier, comprising:

a differential circuit including, pair of switching transistors, each switching resistor being driven complementarily, a pair of load resistors, each load resistor being connected in series to one of the switching transistors, a pair of cascade transistors, each cascade transistor being between one of the load resistors and one of the switching transistors, and a bias control configured to set a base level of the cascade transistors, the base level being higher than an input HIGH level of the switching transistors by a forward voltage of a junction diode subtracted by an offset amount; and an upstream stage configured to drive the differential circuit complementarity, the upstream stage providing a discharge current from one of the switching transistors that turns off through the other of the switching transistors that turns on, wherein the upstream stage includes a preamplifier and an emitter follower connected downstream of the preamplifier, the emitter follower lowering outputs of the preamplifier by the forward voltage of the junction diode, the preamplifier outputting a LOW level thereof determined by a resistor and a current source in the preamplifier, wherein the bias control includes a first current source, a second current source connected in parallel to the first current source, and a resistor connected in series to a parallel circuit of the first and second current sources, the resistor having a resistance corresponding to the resistance of the resistor in the preamplifier, and the second current source providing a current corresponding to a current provided from the current source in the preamplifier, and wherein the offset amount of the base level is determined by a current provided by the first current source multiplied by the resistance of the resistor in the bias control.

6. The amplifier of claim 5, wherein the current provided from the second current source is one n-th of a current provided from the current source in the preamplifier, and the resistance of the resistor in the bias control is n times greater than the resistance of the resistor in the preamplifier.

* * * * *